(12) United States Patent
Hasegawa et al.

(10) Patent No.: US 10,396,025 B2
(45) Date of Patent: Aug. 27, 2019

(54) SEMICONDUCTOR DEVICE AND AMPLIFIER APPARATUS

(71) Applicant: SUMITOMO ELECTRIC DEVICE INNOVATIONS, INC., Yokohama-shi, Kanagawa (JP)

(72) Inventors: Yuichi Hasegawa, Yokohama (JP); Naoyuki Miyazawa, Yokohama (JP)

(73) Assignee: SUMITOMO ELECTRIC DEVICE INNOVATIONS, INC., Yokohama-Shi, Kanagawa (JP)

( * ) Notice: Subject to any disclaimer, the term of this patent is extended or adjusted under 35 U.S.C. 154(b) by 4 days.

(21) Appl. No.: 15/817,552

(22) Filed: Nov. 20, 2017

(65) Prior Publication Data

US 2018/0145023 A1 May 24, 2018

(30) Foreign Application Priority Data

Nov. 22, 2016 (JP) ................................. 2016-227302

(51) Int. Cl.
*H01L 23/66* (2006.01)
*H01L 23/528* (2006.01)
(Continued)

(52) U.S. Cl.
CPC .......... *H01L 23/5223* (2013.01); *H01L 23/36* (2013.01); *H01L 23/3675* (2013.01);
(Continued)

(58) Field of Classification Search
CPC ..... H01L 23/5223; H01L 28/60; H01L 23/66; H01L 23/528; H01L 23/3675; H01L 2223/6611; H01L 2223/6672; H01L 2223/6655; H01L 2223/6616; H03F 3/213; H03F 1/565; H03F 3/195; H03F 2200/225; H03F 2200/451; H03F 2200/387; H03F 2200/391; H03F 2200/222

See application file for complete search history.

(56) References Cited

U.S. PATENT DOCUMENTS 6,072,211 A * 6/2000 Miller ................... H01L 23/642
257/308
2015/0303881 A1* 10/2015 Blednov ................. H03F 3/213
330/289

(Continued)

FOREIGN PATENT DOCUMENTS

JP 2012-146728 8/2012

*Primary Examiner* — Roy K Potter
(74) *Attorney, Agent, or Firm* — Smith, Gambrell & Russell, LLP

(57) ABSTRACT

A semiconductor device that outputs a radio-frequency (RF) signal with high power is disclosed. The semiconductor device includes a housing, a semiconductor chip, an impedance converter, a capacitor, and a bonding wire. The housing includes a heat sink, an output lead terminal, and a bias terminal electrically isolated from the output lead terminal. The semiconductor chip is mounted on the heat sink of the housing. The impedance converter provides an input port, an output port, and an intermediate port between the input port and the output port thereof. The capacitor is mounted on the heat sink and between the impedance converter and the output lead terminal. The bonding wire connects the bias lead terminal with the intermediate port.

16 Claims, 8 Drawing Sheets

(51) Int. Cl.
*H03F 1/56* (2006.01)
*H01L 23/522* (2006.01)
*H01L 23/367* (2006.01)
*H01L 49/02* (2006.01)
*H03F 3/195* (2006.01)
*H03F 3/213* (2006.01)
*H01L 23/36* (2006.01)
*H01L 23/482* (2006.01)

(52) U.S. Cl.
CPC ........ *H01L 23/4824* (2013.01); *H01L 23/528* (2013.01); *H01L 23/66* (2013.01); *H01L 28/60* (2013.01); *H03F 1/565* (2013.01); *H03F 3/195* (2013.01); *H03F 3/213* (2013.01); *H01L 2223/6611* (2013.01); *H01L 2223/6616* (2013.01); *H01L 2223/6655* (2013.01); *H01L 2223/6672* (2013.01); *H01L 2224/48091* (2013.01); *H01L 2224/49175* (2013.01); *H01L 2224/73265* (2013.01); *H03F 2200/222* (2013.01); *H03F 2200/225* (2013.01); *H03F 2200/387* (2013.01); *H03F 2200/391* (2013.01); *H03F 2200/451* (2013.01)

(56) References Cited

U.S. PATENT DOCUMENTS

2017/0338194 A1* 11/2017 Gittemeier .............. H01L 24/05
2018/0145023 A1* 5/2018 Hasegawa ............... H01L 23/36

* cited by examiner

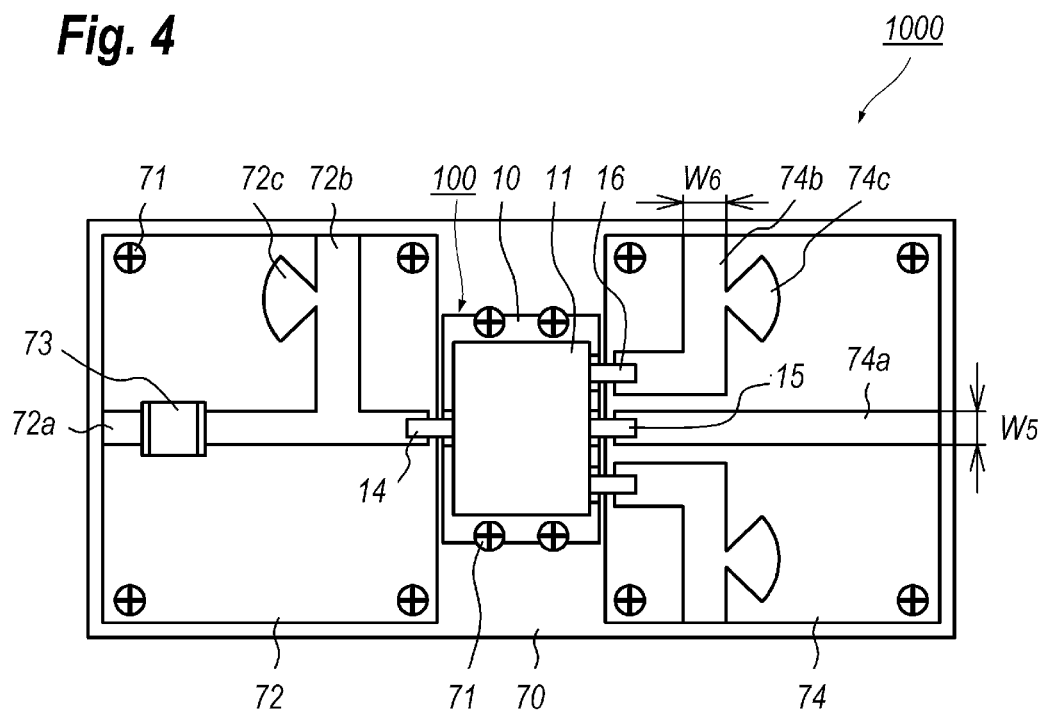

SEMICONDUCTOR DEVICE AND AMPLIFIER APPARATUS

BACKGROUND OF THE INVENTION

1. Filed of the Invention

The present invention relates to a semiconductor module, in particular, the invention relates to a semiconductor electronic module capable of outputting high power.

2. Related Background Arts

A semiconductor module that installs a semiconductor device with matching units that match input/output impedance of the semiconductor module with impedance of the semiconductor device has been well known in the field. A Japanese Patent application laid open No. JP-2012-146728A has disclosed such a semiconductor module. Such a semiconductor module is externally supplied with biases to activate the semiconductor device installed therein through input and output leads. IN order to leak the biases to other circuits, interconnections coupled with the input and output leads are inevitably interposed with coupling capacitors. When the semiconductor module may output high power in high frequencies, an amplified signal with excessive amplitude output therefrom passes the output coupling capacitor, which generates heat in the coupling capacitor and sometimes degrades the capacitor.

SUMMARY OF THE INVENTION

An aspect of the present invention relates to a semiconductor device that outputs a radio-frequency (RF) signal with high power. The semiconductor device comprises a housing, a semiconductor chip, an output impedance converter, an output capacitor and a bonding wire. The housing includes a heat sink, an output signal terminal, and an output bias terminal electrically isolated from the output signal terminal. The semiconductor chip, which generates the RF signal, is mounted on the heat sink of the housing. The output impedance converter has an input port, an output port, and an intermediate port placed between the input port and the output port thereof. The output capacitor is provided between the output impedance converter and the output signal terminal. The bonding wire connects the output bias terminal with the intermediate port of the output impedance converter. A feature of the semiconductor device of the present embodiment is that the capacitor is mounted on the heat sink within the housing.

BRIEF DESCRIPTION OF THE DRAWINGS

The accompanying drawings, which are incorporated in and constitute a part of the present specification, illustrate one or more implementations described herein and, together with the description, explain those implementations. In the drawings:

FIG. 4 is a plan view showing an amplifier apparatus implementing the semiconductor device shown in FIG. 1A;

DESCRIPTION OF EMBODIMENT

First Embodiment

Figure 1A:
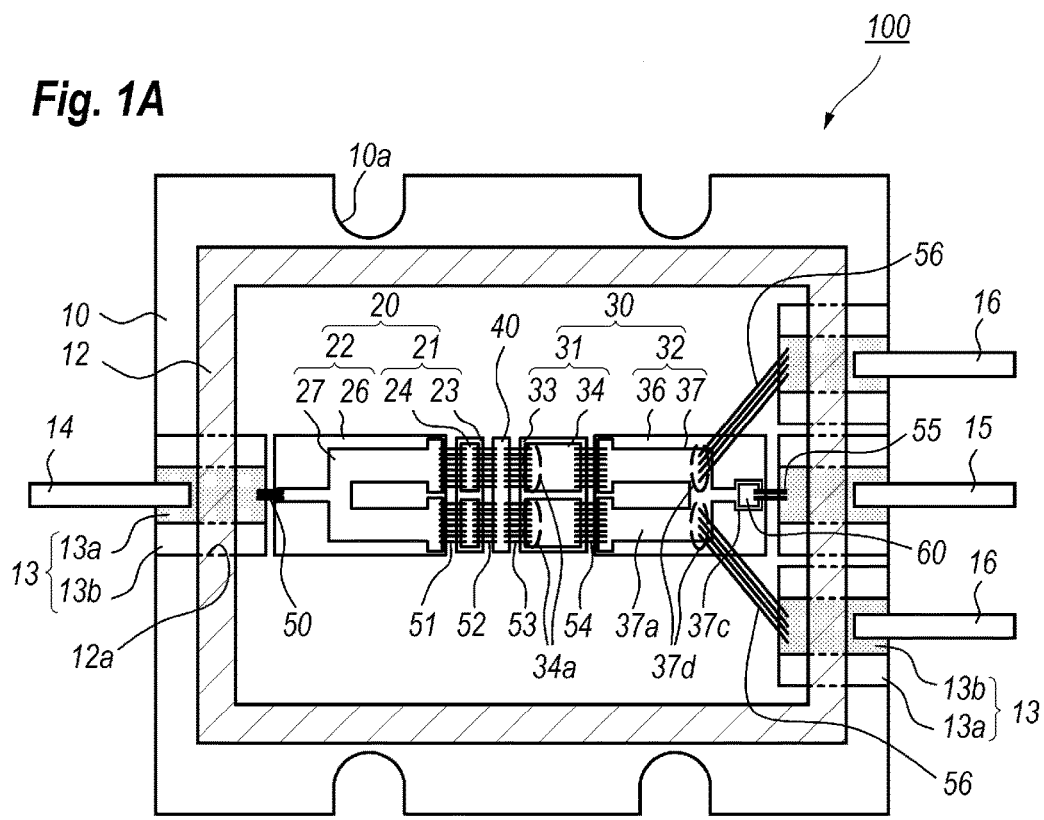
FIG. 1A is a plan view showing a semiconductor device according to the first embodiment of the present invention.
Figure 1B:
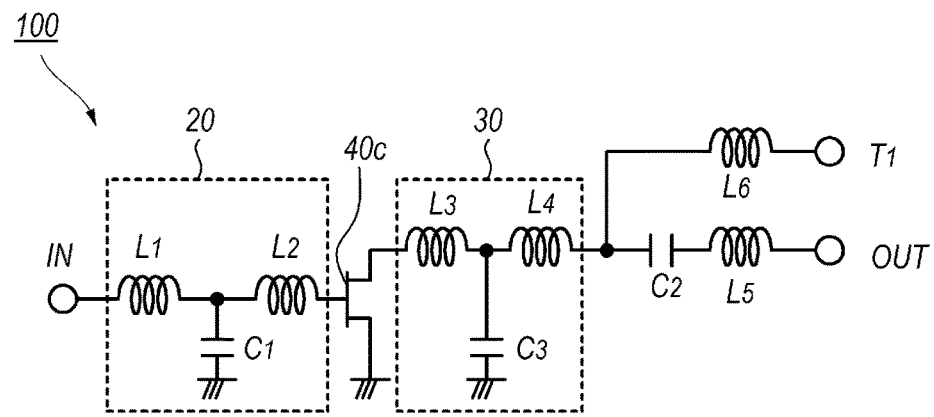
FIG. 1B shows an equivalent circuit diagram of the semiconductor device shown in FIG. 1A.

The first embodiment according to the present invention relates to a semiconductor device applicable to a solid state power amplifier (SSPA) apparatus used in, for instance, a radar system for an air-traffic control and/or a weather observation. An SSPA may amplify a radio-frequency (RF) signal around 10 GHz. FIG. 1A is a plan view showing a semiconductor device 100 according to the first embodiment of the present invention, and FIG. 1B shows an equivalent circuit diagram of the semiconductor device 100 shown in FIG. 1A.

The semiconductor device 100 includes a heat sink 10, input and output impedance converters, 20 and 30, a semiconductor chip 40, and a capacitor 60, which is hereinafter called as the output capacitor. These components, 20 to 60, are hermetically sealed within a space formed by the heat sink 10, a frame 12 and a lid 11. The heat sink 10, the frame 12, the lid 11, and lead terminals, 14 to 16, may form a housing. The impedance converter 20, the semiconductor chip 40, and the other impedance converter 30 are arranged along a line connecting the lead terminals, 13 and 15, within the package, where the former impedance converter 20 may be called as the input impedance converter, while, the latter may be called as the output impedance converter.

The heat sink 10, which may be made of metal, specifically a stacked metals of copper (Cu), molybdenum (Mo), and another copper (Cu) and has a thickness of, for instance, 1.5 mm, shows enough thermal conductivity. The heat sink 10 is electrically grounded and provides cuts 10a through which screws are fastened. Disposed on the heat sink 10 are the impedance converter 20, the semiconductor chip 40, and the other impedance converter 30, where the former impedance converter 20 is sometimes called as the input impedance converter, while, the latter is sometimes called as the output impedance converter. The frame 12, which may be made of ceramics and brazed onto the heat sink 10, surrounds the impedance converters, 20 and 30, and the semiconductor chip 40. The frame 12 provides an aperture 12a in one of walls through which a feedthrough 13 passes.

The impedance converter 20 is disposed between the input signal terminal 14 and the semiconductor chip 40; while, the other impedance converter 30 is disposed between the output signal terminal 15 and the semiconductor chip 40. The former input signal terminal 14 is called as the input signal terminal; while, the other output signal terminal 15 is called as the output signal terminal. The impedance converters, 20 and 30, may match or convert input impedance and output impedance of the semiconductor chip 40 with input impedance and output impedance of the semiconductor device 100 that are viewed from the signal terminals, 14 and 15, respectively. The impedance converters, 20 and 30, each include matching units, 21 and 31, couplers, 22 and 32, and bonding wires, 51 and 52, and 53 and 54, respectively, where elements, 21 and 22, may be called as the input one, while, the elements, 31 and 32, may be called as the output one. The matching units, 21 and 31, are disposed closer to the semiconductor chip 40, while, the couplers, 22 and 32, are disposed closer to the frame 12.

Figure 2A:
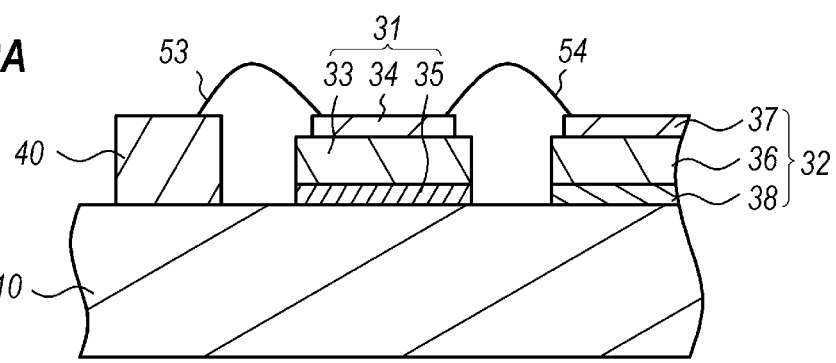
FIG. 2A is a magnified cross section of a matching unit implemented in the semiconductor device shown in FIG. 1A.
Figure 2B:
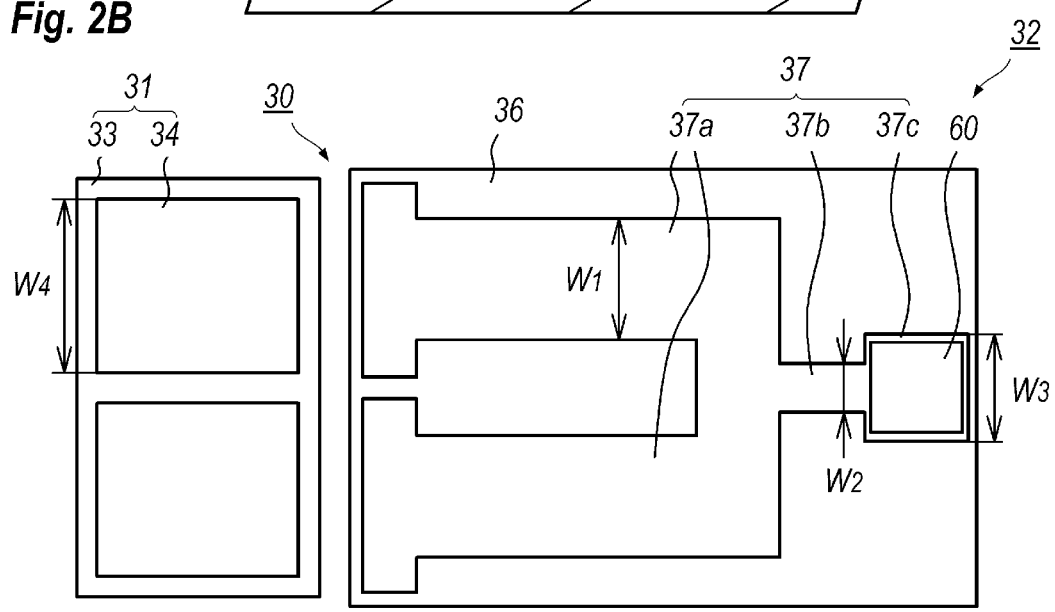
FIG. 2B is plan views of an impedance converter and a capacitor arranged side by side.

FIG. 2A is a magnified cross section of the matching unit 31, while, FIG. 2B is plan views of the impedance converter 30 and the capacitor 60, where FIG. 2B omits bonding wires. The matching unit 31 includes a substrate 33 and top and bottom electrodes, 34 and 35, sandwiching the substrate 33. That is, a top surface of the substrate provides the top electrode 34; while, a back surface thereof provides the back electrode 35. Thus, the matching unit 31 may be operable as a metal-insulator-metal (MIM) capacitor including the top electrode 34, a dielectric material of the insulating substrate 33, and the bottom electrode 35. The bottom electrode 35 is fixed to a top of the heat sink 10 with solder. The substrate 33, which may have a thickness of, for instance, 100 μm, may be made of ceramics with a dielectric constant of 50. The electrodes, 34 and 35, may be made of copper (Cu) and/or gold (Au) with a width $W_4$ of, for instance, 2.5 mm.

Figure 2C:
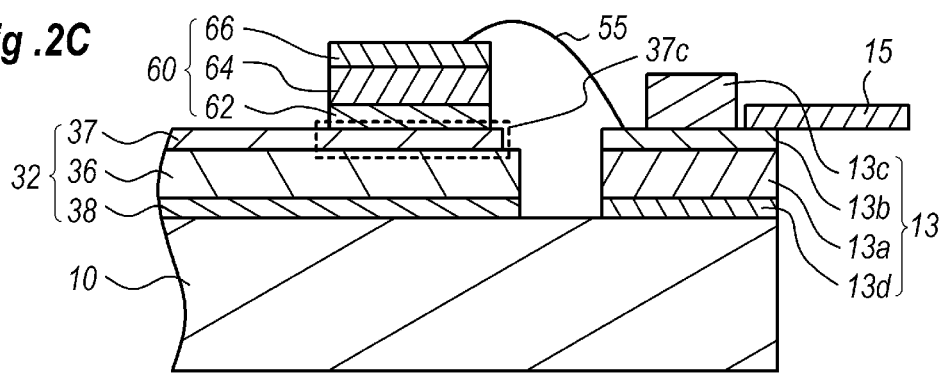
FIG. 2C is a magnified cross section of a coupler and the capacitor.

FIG. 2C shows a magnified cross section of the feedthrough 13, the coupler 32, and the capacitor 60. The coupler 32 includes a substrate 36, a top metal 37, and a back metal 38. The back metal 38, which is provided in a back surface of the substrate 37, may be soldered onto a top surface of the heat sink 10. The top metal 37, which are formed on a top surface of the substrate 36, may form a transmission line type of micro-strip line as setting the back meal 38 in the ground. The substrate 36 may be made of ceramics with di-electric constant of 10 and have a thickness of around 100 μm. The top and back metals, 37 and 38, may be made of copper (Cu) and/or gold (Au).

The top metal 37 includes a branch pattern 37*a*, a stem pattern 37*b*, and a mount pattern 37*c*, where three patterns, 37*a* to 37*c*, are continuously provided. The stem pattern 37*b* connects the mount pattern 37*c* with the branch pattern 37*a*; specifically, the branch pattern 37*a* which is split into two patterns in a region closer to the matching unit 31 and joined into one pattern to be continuous with the stem pattern 38*b*. The stem pattern 37*b* has a width $W_2$ of 2 μm, while, the branch pattern 37*a* in portions split into two has a width $W_1$ greater than that of the stem pattern 37*b*, that is each of the branch patterns has a width $W_1$ of 800 μm. The mount pattern 37*c* has further greater width $W_3$ of 1200 μm, where the mount pattern 37*c* mounts a capacitor 60 thereon.

The capacitor 60 may be a type of MIM capacitor, which includes a back electrode 62, a dielectric slab 64, and a top electrode 66, and operates as a coupling capacitor for cutting a DC component. The dielectric slab 64 may be made of inorganic material containing silicon, typically silicon dioxide ($SiO_2$), silicon nitride (SiN), silicon oxy-nitride (SiON). The top and back electrodes, 62 and 66, sandwich the dielectric slab 64; thus, the capacitor 60 may be a type of metal-insulator-metal (MIM) capacitor. The back and top electrodes, 62 and 66, are made of copper (Cu) and/or gold (Au). The capacitor 60 is placed on the mount pattern 37*c* on the substrate 36 such that the back electrode 62 is soldered thereto. The top electrode 66 is electrically connected with the top metal 13*b* provided on the feedthrough 13 with a bonding wire 55.

The feedthrough 13, which is mounted on the heat sink 10, includes a lower base 13*a*, an upper base 13*c*, the top metal 13*b*, and the back metal 13*d*. The top metal 13*b* is formed on the lower base 13*a*, while, the upper base 13*c* is mounted of the lower base 13*a*. The back metal 13*d* is provided in a whole back surface of the lower base 13*a*. Although not indicated in figures, the lower base 13*a* and the upper base 13*c* provide metal layers in respective sides thereof. The lower and upper bases, 13*a* and 13*c*, may be made of ceramics, while, the top metal 13*b* and the back metal 13*d* may be made of gold (Au), copper (Cu), and the like. The lower and upper bases, 13*a* and 13*c*, as combined with each other, are fit within an aperture 12*a* formed in the frame 12 and soldered to the heat sink 10 and the aperture 12*a*.

A output signal terminal 15, which may be the output signal terminal, is fixed to the top metal 13*b* provided on the lower base 13*a* of the feedthrough 13. Other lead terminals 16, which may be an output bias terminal electrically isolated from the output signal terminal 15, are fixed to other feedthroughs 13 provided in respective sides of the former feedthrough 13 from which the output RF signal is extracted. A input signal terminal 14, which may be an input signal terminal isolated from the output signal terminal 15 and the output bias terminal 16, is extracted from the feedthrough 13 provided in a side of the frame 12 opposite to the feedthroughs 13 above described. Thus, the lead terminals, 13 to 15, are electrically isolated from each other and fixed to the top metals 13*b* on the respective feedthroughs 13. The top metals 13*b* on the feedthroughs 13 have impedance of, for instance, 50Ω against the metal patterns surrounding the lower base 13*a* and the upper base 13*c*.

The matching unit 21 includes a substrate 23, a top electrode 24, and a back metal formed on a back surface of the substrate 23 as FIG. 1A illustrates, and may operate as a capacitor similar to the matching unit 31. The coupler 22 provides a substrate 26, a top metal 27, and a back metal provided on a back surface of the substrate 26, may operate as a transmission line similar to the other coupler 32. The top metal 27 has top metal same with that of the top metal 37 except for an area where the capacitor is mounted.

Figure 3A:
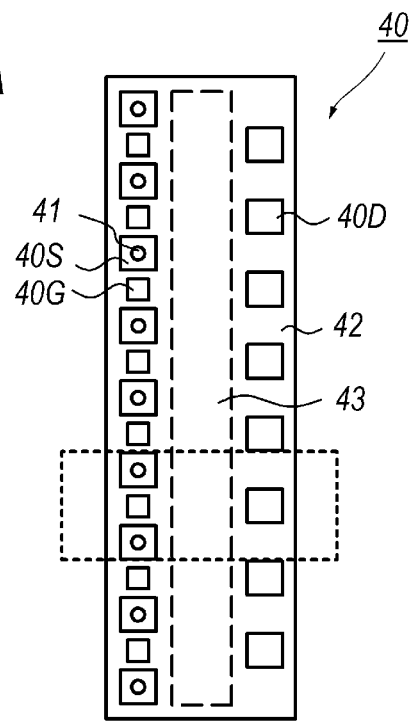
FIG. 3A is a plan view of a semiconductor chip implemented within the semiconductor device shown win FIG. 1A, and FIG. 3B magnifies an area surrounded by a dotted line in FIG. 3A.
Figure 3B:
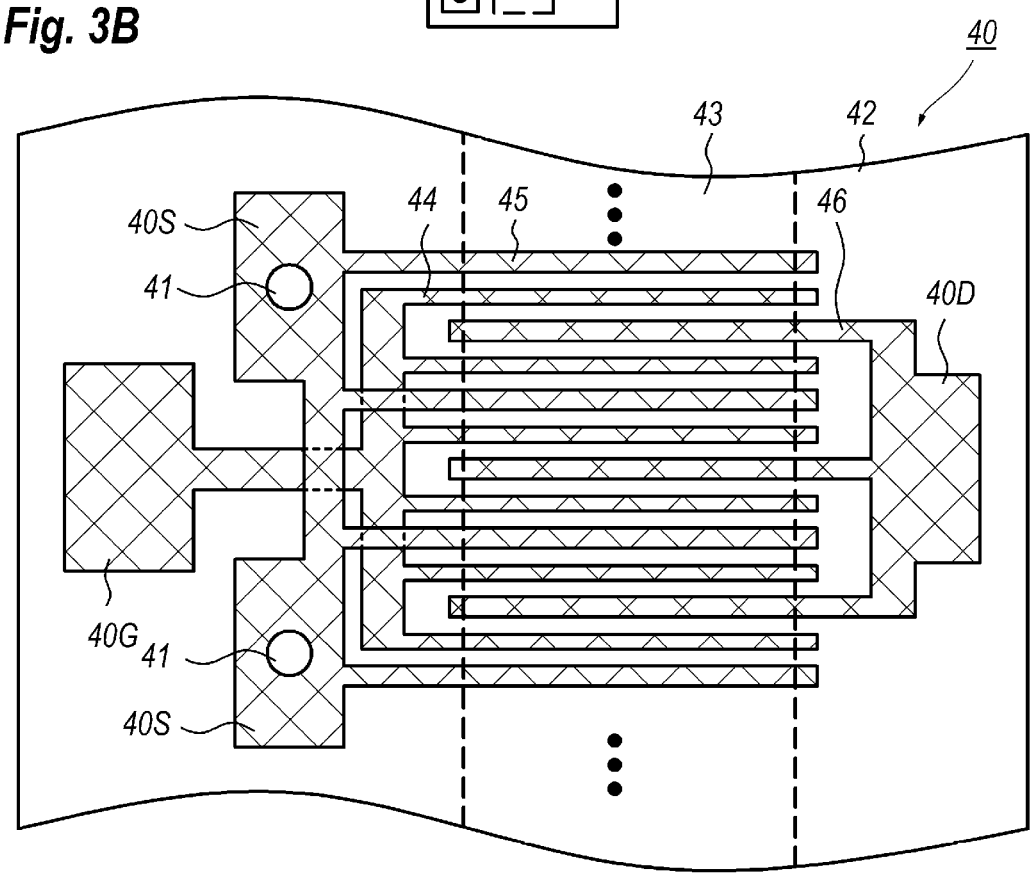

FIG. 3A is a plan view showing a semiconductor chip 40 implemented within the semiconductor device 100 of FIG. 1A, and FIG. 3B magnifies an area surrounded by dotted square in FIG. 3A. FIG. 3B indicates pads and finger electrodes by hatched areas.

The semiconductor device 40 may be a type of field effect transistor (FET) primarily made of, for instance, nitride semiconductor materials. The substrate 42, which may be made of silicon carbide (SiC), sapphire ($Al_2O_3$), and the like, provides semiconductor layers thereon, where the semiconductor layers may include a channel layer of gallium nitride (GaN) and a barrier layer of aluminum gallium nitride (AlGaN). Although the explanation concentrates on a FET made of nitride semiconductor materials, an FET may be made of, for instance, gallium arsenide (GaAs).

The substrate 42 further includes an electrically active region 43 that shows substantial conductivity. The active region 43 is put between inactive regions that have substantial resistivity for isolating the active region 43. The substrate 42 may further provide gate pads 40G, source pads 40S, and drain pads 40D, where the source pads 40S and the gate pads 40G are disposed alternately on one side of the active region 43, while, the drain pads 40D are disposed on another side of the active region 43. The source pads 40S are grounded through source vias 41 that pierce the substrate 42 and are filled with metal. Thus, the source pads 40S are directly connected with back metal formed in the back surface of the substrate 42 and with ground.

The gate fingers 44, the source fingers 45, and the drain fingers 46 are drawn out from the gate pads 40G, the source pads 40S, and the drain pads 40D, respectively, within the active region 43. The source fingers 45 and the drain fingers 46 are alternately arranged, while, the gate fingers 44 are disposed between the source fingers 44 and the drain fingers 46.

A semiconductor device is necessary to have an extremely long gate width in order to realize output power exceeding 100 W. Accordingly, such a semiconductor device usually provides, what is called, the multi-finger arrangement that divides the extremely long gate width into a number of fingers each having a practical gate width. The semiconductor device 100 shown in FIGS. 3A and 3B provides the number of the gate pads 40G and the drain pads 40D. In an arrangement where the multi-fingered gate and the multi-fingered drain each have only one pad, RF signals provided to the fingers arranged far from the only one pad cause phase shifts compared with those provided to the fingers arranged closer to the only one pad. Accordingly, a semiconductor device having the multi-finger arrangement usually provides a number of gate pads, source pads, and drain pads to reduce the phase shift between the fingers. Because such a semiconductor device capable of outputting high power has a long gate width, impedance of the respective pads, or the electrodes of the gate, source, and drain viewing from an outside of the semiconductor device becomes low.

Next, a connection between components within the semiconductor device 100 will be described. The top metal 27 of the coupler 22 is connected with the input signal terminal 14 through bonding wire 50 and the top metal 13b on the feedthrough 13. The top metal 27 is also connected with the electrode 24 of the matching unit 21 with bonding wire 51, and this electrode 24 of the matching unit 21 is connected with the gate pads 40G of the semiconductor device 40 with other bonding wire 52. The bonding wires, 50 to 56, may be made of gold (Au) and/or aluminum (Al).

In another side with respect to the semiconductor device 40, the drain pads 40D are connected with the top electrode 34 of the matching unit 31 with the bonding wire 53. The top electrode 34 of the matching unit 31 in a portion closer to the semiconductor device 40, which is circled by a broken line in FIG. 1A, is denoted as an area 34a. The top electrode 34 of the matching unit 31 is connected with the branch pattern 37a of the coupler 32 with the bonding wire 54.

As FIG. 2C illustrates, the capacitor 60 in the back electrode 62 thereof is fixed to, specifically is soldered with the mount pattern 37c of the top metal 37 of the coupler 32. The top electrode 66 is connected with the output signal terminal 15 through the bonding wire 55 and the top metal 13b on the feedthrough 13. Referring to FIG. 1A again, the branch pattern 37a in portions closer to the stem pattern 37b, which is circled by a broken line and referred as an intermediate port 37d, is connected with the output bias terminal 16 through the bonding wire 56 and the top metal 13b on the feedthrough 13. The description above refers respecting bonding wires, 50 to 56, collectively to a single wire; however, as FIG. 1A clearly illustrates, the bonding wires, 50 to 56, each include a plurality of wires having lengths substantially same with each other to suppress phase shifts at high frequencies.

FIG. 1B shows an equivalent circuit diagram of the semiconductor device 100 shown in FIG. 1A. The equivalent circuit has the impedance converter 20 between the input terminal IN and the gate of the semiconductor device 40c type of a field effect transistor (FET), where the impedance converter 20 includes two inductors, $L_1$ and $L_2$, connected in series between the input terminal IN and the gate 40c, and a capacitor $C_1$ connected between an inter mediate node of two inductors, $L_1$ and $L_2$, and the ground. The FET is operated in the source grounding mode. Another impedance converter 30 is put between the drain of the FET 40c and the output terminal OUT. The impedance converter 30 also includes two inductors, $L_3$ and $L_4$, connected in series between the drain and the output terminal OUT, and a capacitor $C_3$ connected between an intermediate node of two inductors, $L_3$ and $L_4$, and the ground. A series circuit of a capacitor $C_2$ and an inductor $L_5$ are put between the impedance converter 30 and the output terminal OUT. Another inductor $L_6$ is connected between the impedance converter 30 and the terminal T1.

The input terminal IN corresponds to the input signal terminal 14 shown in FIG. 1A, while, the output terminal OUT corresponds to the output signal terminal 15. The FET 40c corresponds to the semiconductor chip 40. The inductor $L_1$ corresponds to a sum of inductive components of the bonding wires, 50 and 51, and the coupler 22, where the bonding wires, 50 and 51, each include a number of wires arranged in parallel and inductive components thereof also connected in parallel. The capacitor $C_3$ corresponds to the matching unit 31; while, the inductor $L_4$ corresponds to the output couple 32 and a number of bonding wires 54 collectively arranged in parallel. The capacitor $C_2$ shows the capacitor 60. The inductor $L_5$ collectively corresponds to a number of bonding wires 55. The inductor $L_6$ also collectively corresponds to a number of bonding wires 56. The terminal T1 corresponds to the output bias terminal 16.

An operation of the semiconductor device 100 will be described. The input signal terminal 14 supplies a gate bias to the gate pad 40G of the semiconductor chip 40, while, the other lead 16 provides a drain bias to the drain pad 40D of the semiconductor chip 40. The source pad 40S of the semiconductor chip 40 is directly grounded to the heat-sink 10. The input signal terminal 14 also supplies an RF-signal with frequencies of, for instance, a few hundreds of mega-hertz to a few hundreds of giga-hertz in microwave, sub-millimeter, and/or millimeter wavelength bands, to the semiconductor chip 40 through the feedthrough 13 and the impedance converter 20. The output signal terminal 15 outputs another RF signal that is amplified by the semiconductor chip 40 through the impedance converter 30 and the feedthrough 13. Thus, the semiconductor device 100 is an amplifier apparatus that amplifies an RF signal.

An SSPA may have a number of gate fingers 44 to widen a total gate width, as shown in FIG. 3B, and provide a number of drain pads 40D. Because the drain pads 40D, which are commonly connected to the top electrode 34 of the matching unit 31, the output impedance of the semiconductor device 40 viewed from the matching unit 31, that is, the impedance of the semiconductor chip 40 viewing at the input poer of the matching unit 31 becomes relatively low, for instance, 5 to 15Ω. On the other hand, the output impedance of the semiconductor device 100 viewing at the output signal terminal 15 is necessary to be, for instance, around 50Ω to match with the characteristic impedance of the transmission line connected to the output signal terminal 15. The impedance converter 30 may compensate this mismatching in the impedance; that is, the impedance converter 30 may transform in the impedance of the semiconductor chip 40 at the input port of the matching unit 30 that is connected to the semiconductor device 40 to the output impedance of the semiconductor device 100 viewing at the output signal terminal.

The impedance converter 30 may form, what is called, a T-type LCL circuit shown in FIG. 1B by the number of bonding wires, 53 and 54, the matching unit 31, and the coupler 32. Among them, the matching unit 31 in the capacitive component thereof, the bonding wire 43 and the coupler 32 in the inductive components thereof primarily contribute to the T-type LCL circuit. The input impedance of the T-type LCL circuit viewed from the semiconductor chip 40 becomes 5 to 15Ω, which is comparable to the output impedance of the semiconductor chip 40; while the impedance viewing the semiconductor chip 40 increases as approaching the output signal terminal 15. The output impedance of the T-type LCL circuit becomes around 50Ω.

Similarly, the input impedance of the impedance converter 20 viewed from the input signal terminal 14 matches with the input impedance of the semiconductor device 40, and the input impedance of the impedance converter 20 matches with the input impedance of the semiconductor device 100 viewing the semiconductor chip at the input signal terminal 14, which become substantially 50Ω.

FIG. 4 is a plan view of an RF-amplifier apparatus 1000 of the type of solid state power amplifier (SSPA) implementing the semiconductor device 100 of the present embodiment. The RF-amplifier apparatus 1000 includes a base 70, an input board 72, an output board 74, and a semiconductor device 100. Two boards, 72 and 74, and the semiconductor device 100 are arranged along a line and fixed to the base 70 with screws 71. The base 70 may be made of metal, typically copper (Cu), while, the input and output boards, 72 and 74, may be made of ceramics and/or resin.

The input board 72 in a top surface thereof provides transmission lines, 72a and 72b, where the latter accompanies with a radial stub 72c. The signal line 72a in one end thereof is connected with the input signal terminal 14 of the semiconductor device 100, while, the other end extends to an edge of the input board 72. The other line 72b, which is branched from the signal line 72a at a point just in front of the input signal terminal 14, provides the radial stub 72c in a midway thereof. The radial stub 72c in a root portion thereof may be equivalently regarded as a ground in the alternate current (AC) mode, and setting a distance from the point at which the line 72b is branched from the signal line 72a to the root of the radial stun 72c to be λ/4; the line 72b may be regarded as an open circuit viewing from the signal line 72a. The input board 72 further provides a capacitor 73 on the signal line 72a at a position behind the edge of the input board 72 that cuts the DC component contained in the bias provided on the signal line 72b.

The output board 74 also provides a signal lines 74a pulled out from the output signal terminal 15 to an edge of the output board 74 and two lines 74b each pulled out from the respective output bias terminals 16 to respective sides of the output board 74. The lines 74b, which may be called as the bias line, accompany with respective radial stubs 74c. Because the semiconductor device 100 implements a capacitor 60 in the output thereof to cut the DC component, the signal lines 74a mounts no capacitor.

The signal lines, 72a and 74a, configure transmission lines against the base 70 with a width $W_5$ by which the transmission impedance thereof matches with the input impedance of the semiconductor device 100 viewing an inside thereof at the input signal terminal 14 and with the output impedance of the semiconductor device 100 viewing the inside thereof at the output signal terminal 15. In the present embodiment, the transmission lines, 72a and 74a, have impedance of 50Ω. A width $W_6$ of the bias lines, 72b and 74b, is wider than the width $W_5$ of the transmission lines, 72a and 74a, which may reduce series resistance of the bias lines, 72b and 74b. The radial stubs 74c, as described above, may terminate the bias lines, 72b and 74b, in high frequencies.

The gate bias is supplied to the semiconductor device 100 through the lines, 72b and 72a, while, the drain bias is supplied to the output bias terminal 16 through the bias lines 74b. The RF signal is provided to the gate of the semiconductor device 100 through the transmission line 72a and the capacitor 73 that passes high frequency components but cut low frequency components and a DC component. The amplified RF signal may be output through the transmission line 74a.

According to the first embodiment, as FIGS. 1A and 2C illustrate, the capacitor 60 is mounted on the heat sink 10 in the semiconductor device 100, heat generated by the capacitor 60 by passing the RF signal therethrough may be dissipated directly to the heat sink 10, which may effectively suppress the capacitor 60 from raising a temperature thereof. Even the amplified RF signal has the power exceeding 100 W; the capacitor 60 may avoid degradation or burnout thereof.

Also, because the capacitor 60 is inserted between the output impedance converter 30 and the output signal terminal 15, the drain bias is unable to be supplied to the semiconductor device 100 through the output signal terminal 15. Therefore, the drain bias may be provided through the output bias terminal 16 and the bonding wire 56. Specifically, one end of the bonding wire 56 is bonded with the intermediate port 37d of the output impedance converter 30 between the input and the output ports thereof, while, another end of the bonding wire 56 is connected to the output bias terminal 16 through the feedthrough 13. Thus, the drain bias may be supplied to the semiconductor device 40 through the output bias terminal 16, the bonding wire 56, and the output impedance converter 30, The impedance viewing the semiconductor chip 40 at the intermediate port 37d on the output impedance converter 30 is lower than the impedance viewing the semiconductor chip 40 at the output signal terminal 15. The bonding wire 56 connected to the inter mediate port 37d may equivalently show large impedance, which may effectively shield the output bias terminal 16 and the bias line 74b from the semiconductor chip 40 in high frequencies.

The capacitor 60, as shown in FIG. 2C, has the type of MIM capacitor that inherently shows smaller parasitic resistive and inductive components compared with, what is called, a chip capacitor having interdigital electrodes. Accordingly, heat generated thereby may be further suppressed even an RF signal with higher power passes therethrough.

The output impedance converter 30 provides the branch pattern 37a with an enhanced width and the stem pattern 37b with a shrunk width, where the bonding wire 56 in one end thereof is bonded with the former pattern, the branch pattern 37a with an enhanced width, which may suppress the output impedance converter 30 from generating heat.

The impedance converter 30 includes the matching unit 31 and the coupler 32. The bonding wire 53 connects the top electrode 34 of the matching unit 31 with the semiconductor chip 40, while, the bonding wire 54 connects the top electrode 34 with the top metal 37 of the coupler 32, which may convert the impedance between the semiconductor chip 40 and the output bias terminal 16 by inductive elements, $L_3$ and $L_4$, and a capacitive element $C_3$, as shown in FIG. 1B. The other impedance converter 20 may convert the impedance between the semiconductor chip 40 and the input signal terminal 14.

Two branch patterns 37a are joined into the one stem pattern 37b in the coupler 32 that may form a part of the impedance converter 30. The RF signal joined in the coupler 32 may be output from the output signal terminal 15 through the capacitor 60. The matching unit 31 may include a part 34a, which may be regarded as the input port of the impedance converter 30 and the number of the drain pads are commonly connected thereto. It is hard or almost impossible for the semiconductor device 40 to implement one or more capacitors to cut the DC component because respective drain pads cause phase differences between RF signals output therefrom and generate unintentional high frequency components. Accordingly, the capacitor 60 is put outside of the semiconductor device 40, specifically, in downstream of the impedance converter 30. The intermediate port 37d of the branch pattern 37a of the top metal 37, to which the bonding wire 56 is attached, exists between the drain pads 40D of the semiconductor device 40 and the capacitor 60, which may supply the drain bias through the lead terminals 16 and the bonding wire 56, and the capacitor 60 may operate as a coupling capacitor to cut the DC component.

The capacitor 60 is mounted on the mount pattern 37c of the top metal 37 of the coupler 32, which may enhance the heat dissipation from the capacitor 60 to the heat sink 10 through the substrate 36; thus, the capacitor 60 in a temperature thereof may be suppressed to be raised. The semiconductor device 40 of the embodiment may output power from the drain pad 40D thereof that exceeds several hundreds of watts, which possibly causes the capacitor 60 to be raised in a temperature thereof. The capacitor 60 directly mounted on the heat sink 10 may be suppressed in a temperature thereof to be raised. The semiconductor device 40 of the embodiment may be a type except for field effect transistor (FET), but preferably a type of FET made of nitride or arsenic materials for the high power application.

As FIG. 1A indicates, the bonding wire 56 becomes longer because the branch pattern 37a positions apart from the output bias terminal 16 compared with the mount pattern 37c, which results in greater inductance attributed to the bonding wire 56. Thus, the bonding wire 56 may operate as a choke coil to show large impedance and the RF signal amplified by the semiconductor chip 40 becomes hard to be leaked to the output bias terminal 16. On the other hand, the bonding wire 55 connecting the top electrode 66 of the capacitor 60 with the top metal 13b on the feedthrough 13 becomes shorter, which causes relatively smaller inductance and may carry the amplified RF signal onto the output signal terminal 15.

The capacitor 60 may have any type except for the MIM type. In order to suppress the generation of heat, the MIM type becomes preferable with the back electrode 62 thereof fully in contact with the mount pattern 37c of the top metal 37 of the coupler 32. This arrangement may accelerate the dissipation of the heat to the heat sink 10 because the contact area between the back electrode 62 and the mount pattern 37c becomes a maximum.

The bonding wire 55 may connect the top electrode 66 of the capacitor 60 with the top metal 13b on the feedthrough 13. The wire-bonding of the bonding wire 55 may be carried out concurrently with the wire-boning for the other bonding wires, 50 to 54 and 56, which makes the process of assembling the semiconductor device 100 simple and reduce cost thereof.

The heat sink 10 may be made of stacked metals including copper (Cu) and molybdenum (Mo), which shows excellent thermal conductivity. The heal sink 10 may be made of metal slab of copper (Cu).

The impedance converter 30 is not restricted in the arrangement thereof to that shown in FIG. 1A and FIG. 2B. For instance, the top metal 37 may have patterns except for those shown in FIG. 1A and FIG. 2B. The branch pattern 37a may include only one pattern, or three or more patterns each connected with the semiconductor chip 40 through the matching unit 31. Also, the branch pattern 37a preferably has a width, while, the stem pattern 37b has a width narrower than the width of the branch pattern 37a in order to reduce resistance from the intermediate port 37d to which the bonding wire 56 are attached to the semiconductor chip 40, where the bias current for the semiconductor chip 40 flows. The width $W_1$ of the branch pattern 37a may be wider than 2.5 mm, or twice or more wider than that $W_2$ of the stem pattern 37b. Also, although the matching unit 31 provides one top electrode 34 in the embodiment, the matching unit 31 may have two or more top electrodes 34 each forming capacitors against the bottom electrode 35 facing and fixed to the heat sink 10. In an alternative, the matching unit 31 may commonly provide the substrate 33 with the substrate 36 of the coupler 32. That is, the substrate 36 may provide not only the top metal 37 but the top electrode 34 for the matching unit 31. The impedance converter 30 may remove the matching unit 31 by making the coupler 32, in particular, the branch pattern 37a in the top metal 37 thereof to have the function of the matching unit 31. All those arrangements including modifications thereof may be applied to the impedance converter 20.

The semiconductor chip 40, the impedance converters, 20 and 30, are heimetically enclosed within a space formed by the heat sink 10, the frame 12, and the lid 11. The lead terminals, 14 to 16, may realize the electrical connection with the semiconductor chip 40. As FIG. 1A illustrates, those electrical components of the semiconductor chip 40, the impedance converters, 20 and 30, and the capacitor 60 are disposed on a line connecting the input and output lead terminals, 14 and 15; while, the output bias terminal 16 and the output signal terminal 15 are disposed along another direction perpendicular to the line. The bonding wire 56 connects the output bias terminal 16 with the component arranged in a center of the space, while, the bonding wire 55 connecting the output signal terminal 15 with the component, which is the capacitor 60, arranged in relatively periphery in the space, which makes the former bonding wire 56 longer compared with the latter bonding wire 55. Thus, the former bonding wire 56 may have substantial inductance, or impedance for the RF signal amplified by the semiconductor chip 40. The arrangements of the components, 20 to 60, and those of the lead terminals, 15 and 16, are not restricted to that described above. A key feature is that the bonding wire 56 extending from the output bias terminal 16 become longer compared with the bonding wire 55 extending from the signal output signal terminal 15.

The amplifier apparatus 1000 implementing the semiconductor device 100 may also enhance the heat dissipation. Two metal patterns, 74a and 74b, where the for icier carries the RF signal thereon, while the latter carries the bias, become independent from each other. Accordingly, the former pattern 74a may be designed only taking the impedance matching into account, while, the latter pattern 74b may take only the resistance thereof into account because the latter pattern 74b carries no RF signal. That is, the latter pattern 74b may be designed wider enough compared with the width $W_6$ of the former pattern 74a.

Second Embodiment

Figure 5A:
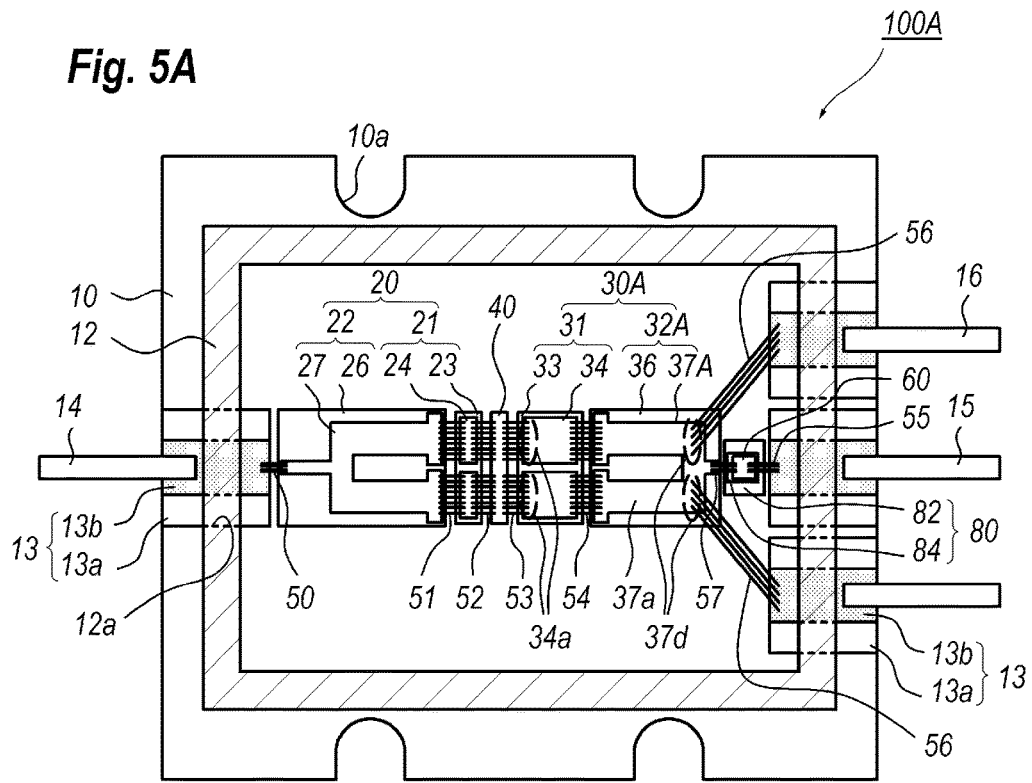
FIG. 5A is a plan view showing a semiconductor device according to the second embodiment of the present invention.
Figure 5B:
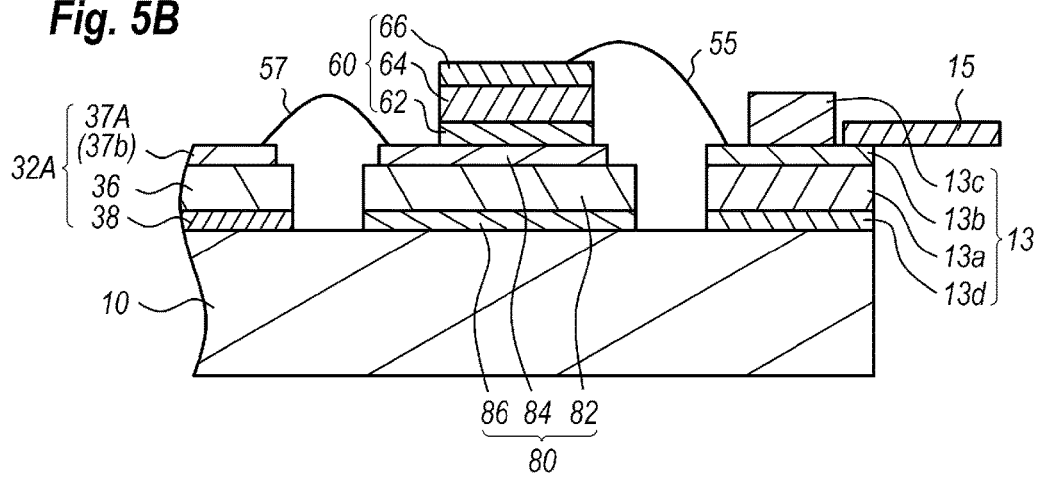
FIG. 5B shows a cross section of the feedthrough, the sub-mount with the capacitor thereon and the coupler.

The second embodiment according to the present invention has a feature that the capacitor 60 is mounted on the heat sink 10 through a sub-mount 80, which is shown in FIG. 5A as a plan view of the semiconductor device 100A and magnified in FIG. 5B as a cross sectional view around the sub-mount 80, the feedthrough 13 and the coupler 32.

The sub-mount 80 is directly mounted on the heat sink 10 between the coupler 32 and the feedthrough 13, where the sub-mount 80 mounts the capacitor 60 thereon. The coupler 32 does not provide the mount pattern 37c on the top metal 37 thereof. The sub-mount 80 includes a base 82, a top metal 84, and a back metal 86. The base 82 may be made of material having thermal conductivity higher than that of the substrate 36 of the coupler 32, which is typically aluminum nitride (AlN). The top and back metals, 84 and 86, may include gold (Au) and/or copper (Cu), where the back electrode 62 of the capacitor 60 is wholly in contact with the top metal 84 of the sub-mount 80 and the top metal 84 is wire-bonded with the stem pattern 37b on the coupler 32 by bonding wire 57. The back metal 85 is wholly soldered to the heat sink 10.

The second embodiment mounts the capacitor 60 on the sub-mount 80. Because the sub-mount 80 has the thermal conductivity higher than that of the substrate 36 of the coupler 32, the capacitor 60 may dissipate heat generated by passing the RF signal with extremely power to the heat sink 10 efficiently. In particular, the back electrode 62 of the capacitor 60 is wholly in contact with the top metal of the sub-mount 80; the heat dissipation to the heat sink 10 may be enhanced. Similar to the semiconductor device 100 of the first embodiment, the bonding wire 56 wire-bonded with the branch pattern 37a may supply the drain bias independent of the output signal terminal 15.

The impedance converter 30 provides the top metal 37 whose plane shape is substantially same with those of the first embodiment except for the omission of the mount pattern 37c for the capacitor 60. Thus, the impedance converter 30 may match the output impedance of the semiconductor chip 40 with the output impedance of the semiconductor device 100A viewing the inside thereof from the output terminal 15.

Third Embodiment

Figure 6A:
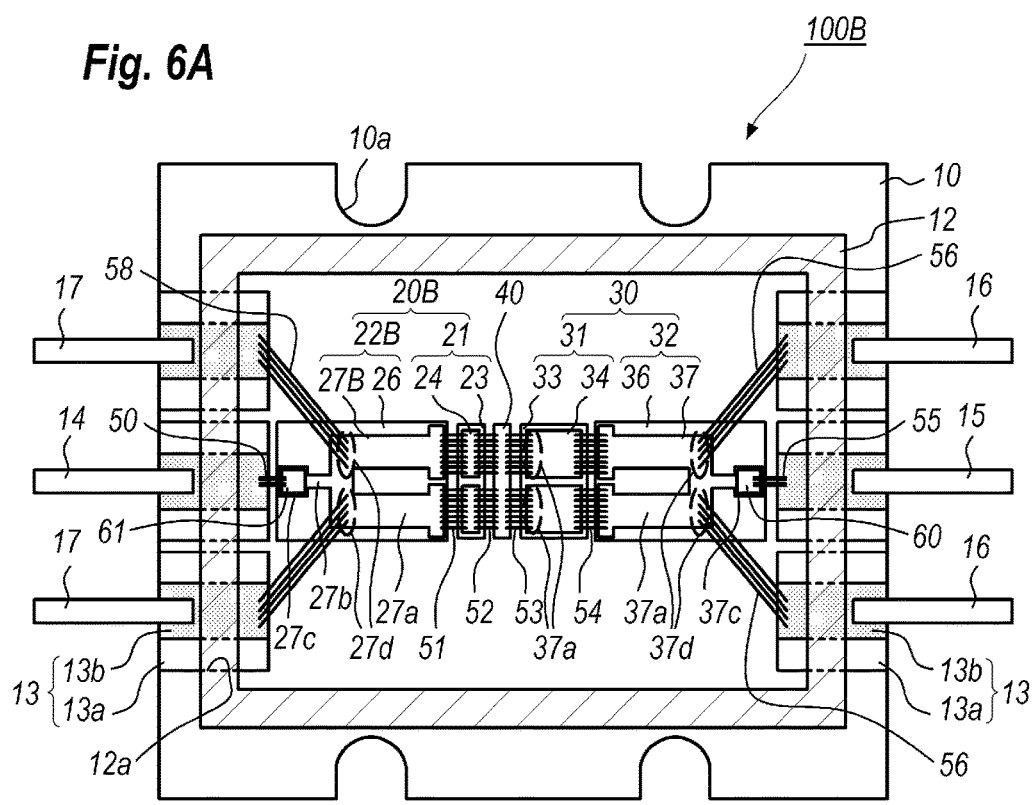
FIG. 6A is a plan view showing a semiconductor device according to the third embodiment of the present invention.

The third embodiment according to the present invention makes the input signal terminal 14 independent of the gate bias for the semiconductor chip 40. FIG. 6A is a plan view showing an inside of the semiconductor device 100B of the third embodiment, and FIG. 6B shows an equivalent circuit diagram thereof.

The semiconductor device 100B provides three apertures 12a in a side of the frame 12 where the input signal terminal 14 is provided, one of the apertures is for the feedthrough 13 of the input signal terminal 14; while the rest two apertures 12a are for feedthroughs 13 of the lead terminals 17 of the gate bias. The top metal 27 of the coupler 22 mounts a capacitor 61 in a mount pattern 27c thereof. The capacitor 61 is a type of MIM capacitor and has a function to cut the DC component, which are same with the aforementioned capacitor 60. Accordingly, the for icier capacitor 60 may be called as the output capacitor while, the latter one may be called as the input capacitor. The capacitor 61 in the back electrode thereof is wholly in contact with the mount pattern 27c of the coupler 22, while, the top electrode thereof is wire-bonded with the input signal terminal 14 through the bonding wire 50 and the upper metal 13b on the feedthrough 13. The bias terminals 17, which are provided in respective sides of the input signal terminal 14, are connected with the top metal 27 of the coupler 22 in an intermediate portion 27d thereof through the top metal 13b on the feedthrough 13 and the bonding wire 58. The intermediate portion 27d exists on a boundary between the branch pattern 27a and the stem pattern 27b, or in a joint portion of the branch pattern 27a.

Figure 6B:
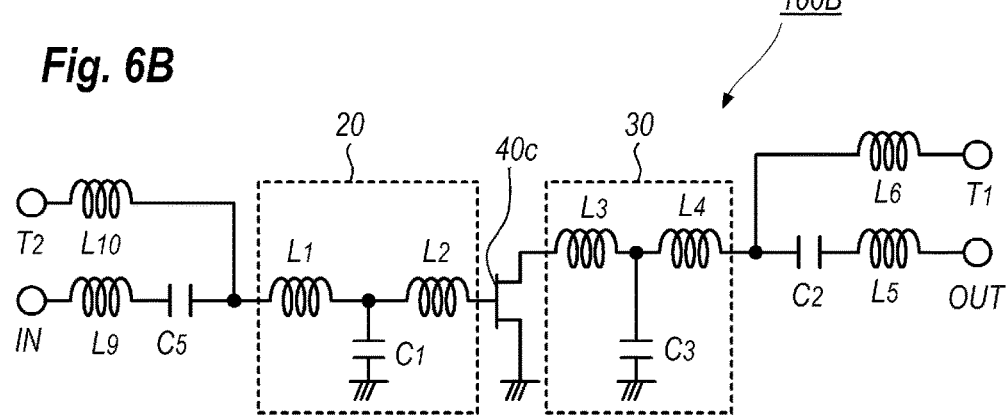
FIG. 6B shows an equivalent circuit diagram of the semiconductor device shown in FIG. 6A.

FIG. 6B shows an equivalent circuit of the semiconductor device 100B that provides inductors, $L_9$, $L_1$ and $L_2$ connected in series and a capacitor $C_5$ between the input terminal IN and the gate of the FET 40c. Connected between the capacitor $C_5$ and the inductor $L_1$ is another inductor $L_{10}$ from the terminal T2. The bonding wires, 50 and 58, are collectively denoted as the inductors, $L_9$ and $L_{10}$. The bonding wires, 51 and 52, connecting the coupler 22 with the matching unit 21 and the matching unit with the semiconductor chip 40, respectively, are also collectively denoted as the inductors, $L_1$ and $L_2$. The capacitor $C_5$ corresponds to the input capacitor 61 and the terminal T2 corresponds to the bias terminals 17.

Because the capacitor 61 is mounted on the heat sink 10 through the coupler 22; the capacitor 61 may be suppressed in a temperature thereof from being raised. Although the capacitor 61 passes the RF signal with power before the amplification by the semiconductor chip 40, the RF signal has substantial power enough to raise the temperature of the capacitor 61. In particular, when the semiconductor device 100B is set in downstream of, for instance, a radar system, the semiconductor device 100B possibly receives an RF signal with high power to raise the temperature of the capacitor 61. The arrangement shown in FIG. 6A, where the input capacitor 61 is mounted on the heat sink 10, may effectively suppress the rise in the temperature of the capacitor 61.

The capacitor 61 put between the input signal terminal 14 and the semiconductor chip 40 makes the gate bias supplied through the input signal terminal 14 impossible. The input bias terminal 17 and the bonding wire 58 may provide the gate bias to the semiconductor chip 40, where the bonding wire 58 is connected between the top metal 13b and the intermediate portion 27d on the top metal 27 between the branch pattern 27a and the stem pattern 27b. Thus, the gate bias may be supplied to the gate of the semiconductor chip 40.

Because the bonding wire 58 is long so as to show large inductance, the bonding wire 58 may operate as a choking coil to shield the input bias terminal 17 from the coupler 22, or the semiconductor chip 40. That is, the RF signal input to the input signal terminal 14 is hard to be leaked toward the input bias terminal 17 and primarily provided to the semiconductor chip 40.

The arrangement on the heat sink 10, that is, the semiconductor chip 40, the impedance converter 20, and the center feedthrough 13 are arranged on the line connecting the two signal lead terminals, 14 and 15; while two feedthroughs 13 to which the input bias terminals 17 are attached sandwich the center feedthrough 13. Moreover, the center feedthrough 13 extracts the bonding wire 50 therefrom on which the RF signal is carried. Thus, the bonding wire 50 is set shorter while the other bonding wire 58 is set relatively longer. Thus, the bonding wire 58 may show large inductance to shield the input bias terminals 17.

The impedance converter 20, specifically, the coupler 22 in the impedance converter 20 also provides the branch pattern 27a and the stem pattern 27b whose width is narrower than that of the branch pattern 27a, which means that the branch pattern 27 may show resistance thereof smaller than that of the stem pattern 27b. Also, the bonding wire 58 is connected to boundaries between the branch patter 27a and the stem pattern 27b, or exactly, a joint portion of the branch pattern 27a. Accordingly, the bias supplied to the bias terminal 17 is directly reflected on the gate of the semiconductor chip 40.

Figure 7:
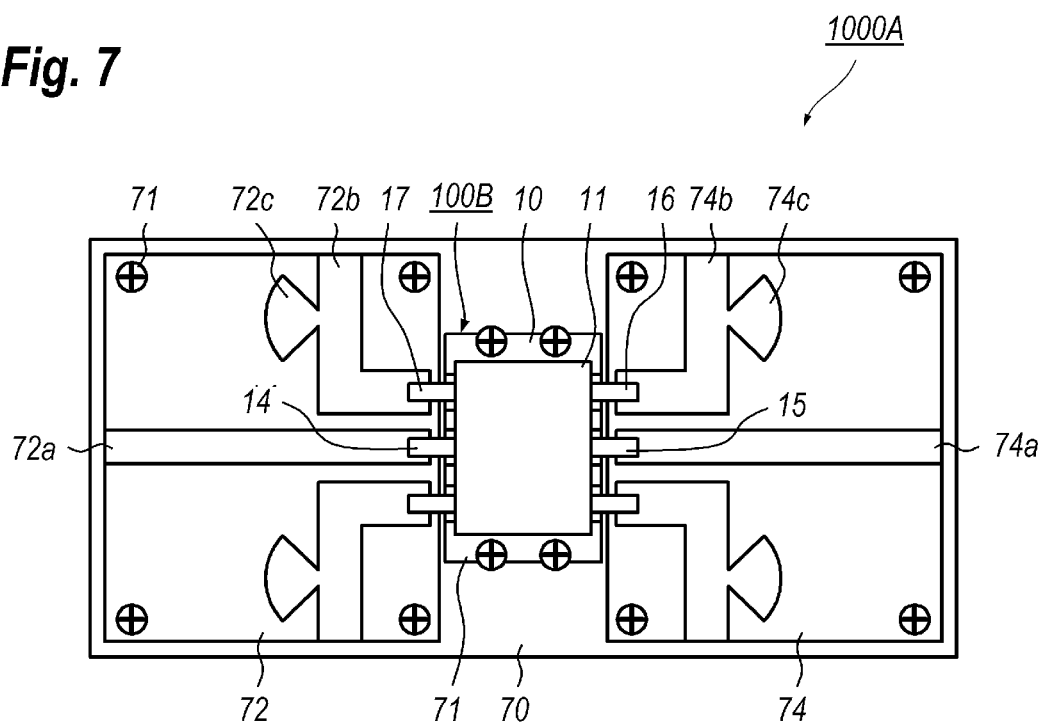
FIG. 7 is a plan view showing an amplifier apparatus implementing the semiconductor device of the third embodiment shown in FIG. 6A.

Similar to the first embodiment, an amplifier apparatus 1000B may be assembled using the semiconductor device 100B. FIG. 7 is a plan view showing the amplifier apparatus 1000B using the semiconductor device 100B shown in FIG. 6. The amplifier apparatus 1000B may omit an input capacitor 73 on the input signal line 72a and an output capacitor on the output signal line 74a. The gate bias may be supplied through the bias lines 72b and the input bias terminals 17; while, the drain bias maybe supplied through the bias lines 74b and the output bias terminals 16. The input bias line 72b and the output bias line 74b each provides radial stubs, 72c and 74c, which make impedance of respective roots low enough. Setting lengths from the bias terminals, 16 and 17, to the roots of the radial stubs, 72c and 74c, to be λ/4; the impedance viewing the respective roots of the radial stubs, 72c and 74c, at the bias terminals, 16 and 17, becomes large enough and the bias sources connected to the bias lines, 72b and 74b, may be effectively shielded from the semiconductor device 100B. Also, setting the bias lines, 72b and 74b, to be wide enough compared with the signal lines, 72a and 74a, the bias lines, 72b and 74b, may have resistance thereof small enough.

Fourth Embodiment

Figure 8:
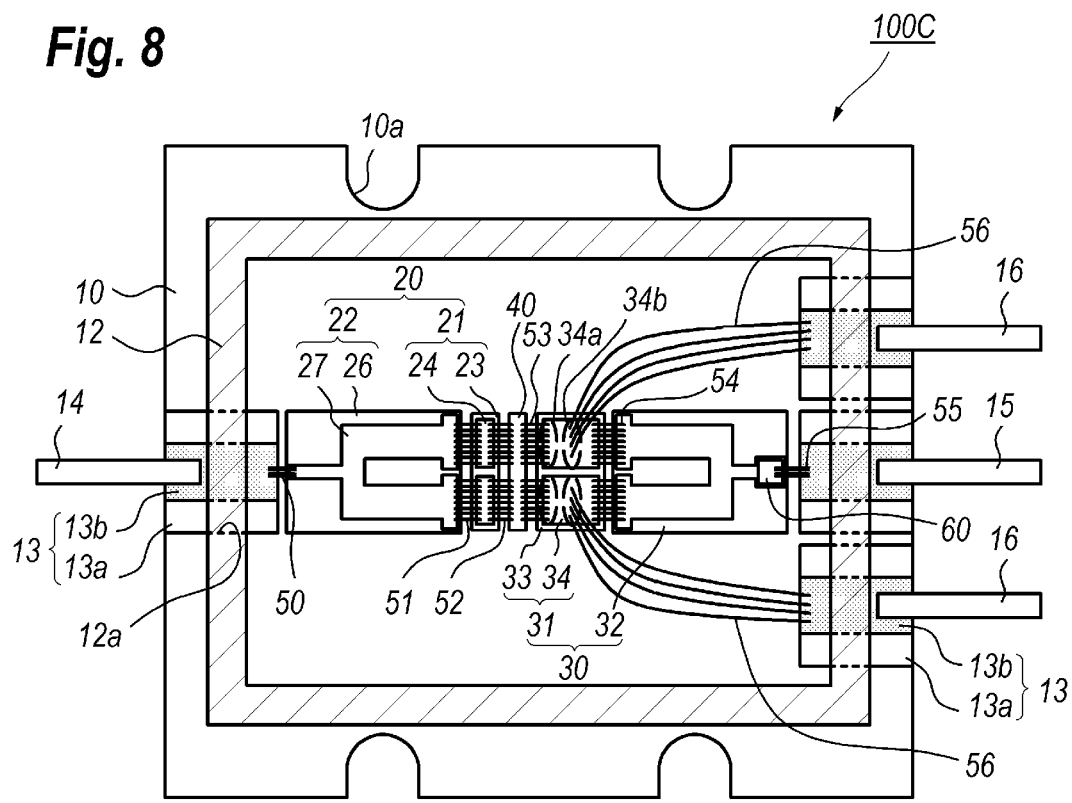
FIG. 8 is a plan view showing a semiconductor device according to the fourth embodiment of the present invention.

The semiconductor device 100C according to the fourth embodiment of the invention has a feature distinguishable from the aforementioned embodiment where the bonding wire 56 connecting the output bias terminal 16 with the impedance converter 30 in a portion of the matching unit 31 not the coupler 32 of the first embodiment shown in FIG. 1A. Specifically, as FIG. 8 illustrates, the bonding wire 56 are connected to the electrode 34 of the matching unit 31.

Even the arrangement of the bonding wire 56 and the matching unit 31, the output capacitor 60 is mounted on the heat sink 10 through the substrate 33, the output capacitor 60 may enhance the function to dissipate heat to the heat sink 10. Also, the drain bias may be supplied to the semiconductor chip 40 from the output bias terminal 16 through the bonding wire 56 and the matching unit 31.

Because the matching unit 31 is disposed apart from the feedthrough 13 for the output bias terminal 16 compared with the coupler 32, which means the bonding wire 56 is necessary to be longer and increase inductive components thereof, namely, the bonding wire 56 may be regarded as an inductor to form a choke coil. The RF signal amplified by the semiconductor chip 40 is further isolated from the output bias terminal 16.

The electrode 34 has a width W4, that is wider than the width W1 of the branch pattern 37a, to make resistance thereof further small and heat generated thereby also further small. The amplifier apparatus 1000 shown in FIG. 4 may implement the semiconductor device 100C instead of the semiconductor device 100 of the first embodiment. Also, the semiconductor device 100C may provide the arrangement of the second embodiment, namely, the coupler 32A and the sub-mount 80; those of the third embodiment including the coupler 22B for supplying the gate bias from the bias terminal 17; and those of the second and the third embodiment, namely, the arrangement of the output capacitor 60 on the sub-mount 80 and the input capacitor 61 on the heat sink 10 through the coupler 22B.

In the foregoing detailed description, the apparatus of the present invention has been described with reference to specific exemplary embodiment thereof. However, it will be evident that further various modifications and changes may be made thereto without departing from the broader spirit and scope of the present invention. Accordingly, the present specification and figures are accordingly to be regarded as illustrative rather than restrictive.

The present application claims the benefit of priority of Japanese Patent Application No. 2016-227302, filed on Nov. 22, 2016, which is incorporated herein by reference.

We claim:

1. A semiconductor device that outputs a radio-frequency (RF) signal with high power, the semiconductor device comprising:
    a housing including a heat sink, an output signal terminal, and an output bias terminal electrically isolated from the output signal terminal;
    a semiconductor chip that generates the RF signal, the semiconductor chip being mounted on the heat sink of the housing;
    an output impedance converter having an input port, an output port, and an intermediate port between the input port and the output port thereof;
    an output capacitor provided between the output impedance converter and the output signal terminal; and
    a bonding wire connecting the output bias terminal with the intermediate port of the output impedance converter,
    wherein the capacitor is mounted on the heat sink within the housing, and
    wherein the output impedance converter has impedance viewing the semiconductor chip at the output port thereof that is greater than impedance viewing the semiconductor chip at the intermediate port thereof.

2. The semiconductor device according to claim 1, wherein the output impedance converter has an output matching unit and an output coupler, the output matching unit including the input port, the output coupler including the output port, the output matching unit connecting the semiconductor chip with the output coupler, the output coupler providing a substrate and a top metal that connects the output matching unit with the output capacitor, and
    wherein the output coupler is mounted on the heat sink and the output capacitor is mounted on the heat sink through the top metal of the output coupler.

3. The semiconductor device according to claim 2, wherein the output capacitor has a type of metal-insulator-metal (MIM) capacitor including a lower electrode and an upper electrode sandwiching a dielectric material therebetween, the lower electrode facing and being in contact with the top metal of the output coupler, the upper electrode being wire-bonded with the output signal terminal.

4. The semiconductor device according to claim 1, wherein the output impedance converter includes an output matching unit and an output coupler, the output matching unit including the input port, the output coupler including the output port, and wherein the output capacitor is mounted on the heat sink through a carrier independent of the output impedance converter, and the carrier is between the output coupler and the output signal terminal.

5. The semiconductor device according to claim 1,
wherein the output impedance converter provides an output matching unit and an output coupler, the output matching unit including the input port, the output coupler including the output port, and
wherein the intermediate port is provided in the output coupler.

6. The semiconductor device according to claim 5,
wherein the output coupler includes a top metal having a branch pattern and a stem pattern, the branch pattern being closer to the output matching unit than the stem pattern, the branch pattern having a width greater than a width of the stem pattern, and
wherein the intermediate port is provided in the branch pattern of the top metal of the output coupler.

7. The semiconductor device according to claim 1,
wherein the output impedance converter provides an output matching unit and an output coupler, the output matching unit including the input port, the output coupler including the output port, and
wherein the intermediate port is provided in the output matching unit closer to the output coupler than the input port.

8. The semiconductor device of claim 1,
wherein the output impedance converter is mounted on the heat sink and includes an output coupler that provides a top metal having a branch pattern, a stem pattern, and a mount pattern, the branch pattern having the input port in a portion facing the semiconductor chip and the intermediate port in another portion continuous with the stem pattern, the branch pattern forming a capacitor with the heat sink.

9. The semiconductor device of claim 8,
wherein the top metal further includes a mount pattern continuous with the stem pattern, the mount pattern mounting the capacitor thereon.

10. The semiconductor device of claim 1, further providing:
an input signal terminal and an input bias terminal electrically isolated from the input signal terminal, the input signal terminal and the input bias terminal being provided in the housing;
an input impedance converter having an input port, an output port, and an intermediate port between the input port of the input impedance converter and the output port of the input impedance converter;
an input capacitor provided between the input impedance converter and the input signal terminal; and
another bonding wire connecting the input bias terminal with the intermediate port of the input impedance converter,
wherein the input capacitor is mounted on the heat sink of the housing.

11. The semiconductor device according to claim 10,
wherein the input impedance converter has impedance viewing the semiconductor chip at the output port thereof that is greater than impedance viewing the semiconductor chip at the intermediate port thereof.

12. The semiconductor device according to claim 10,
wherein the input impedance converter has an input matching unit and an input coupler, the input matching unit including the output port, the input coupler including the input port, the input matching unit connecting the semiconductor chip with the input coupler, the input coupler providing a substrate and a top metal that connects the input matching unit with the input capacitor, and
wherein the input coupler is mounted on the heat sink and the input capacitor is mounted on the heat sink through the top metal of the input coupler.

13. The semiconductor device according to claim 12,
wherein the input capacitor has a type of metal-insulator-metal (MIM) capacitor including a lower electrode and an upper electrode sandwiching a dielectric material of the input capacitor therebetween, the lower electrode of the input capacitor facing and being in contact with the top metal of the input coupler, the upper electrode of the input capacitor being wire-bonded with the input signal terminal.

14. The semiconductor device according to claim 10,
wherein the input impedance converter includes an input matching unit and an input coupler, the input matching unit including the output port of the input impedance converter, the input coupler including the input port of the input impedance converter, and
wherein the input capacitor is mounted on the heat sink through a carrier independent of the input impedance converter, and the carrier is between the input coupler and the input signal terminal.

15. The semiconductor device according to claim 10,
wherein the input impedance converter provides an input matching unit and an input coupler, the input matching unit including the output port of the input impedance converter, the input coupler including the input port of the input impedance converter, and
wherein the intermediate port is provided in the input coupler.

16. The semiconductor device according to claim 15,
wherein the input coupler includes a top metal having a branch pattern and a stem pattern, the branch pattern being closer to the input matching unit than the stem pattern, the branch pattern having a width greater than a width of the stem pattern, and
wherein the intermediate port is provided in the branch pattern of the top metal of the input coupler.

* * * * *